United States Patent
Huang et al.

(10) Patent No.: US 9,245,079 B1
(45) Date of Patent: Jan. 26, 2016

(54) COMPUTER IMPLEMENTED METHOD FOR PERFORMING EXTRACTION

(71) Applicant: UNITED MICROELECTRONICS CORP., Hsin-Chu (TW)

(72) Inventors: Kuo-Hsun Huang, Taichung (TW); Hsi-Chang Chang, Taichung (TW); Chao-Yao Chiang, Hsinchu (TW); Chien-Hung Chen, Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/324,231

(22) Filed: Jul. 6, 2014

(51) Int. Cl.
*G06F 17/50* (2006.01)

(52) U.S. Cl.
CPC ........ *G06F 17/5072* (2013.01); *G06F 17/5081* (2013.01); *G06F 17/504* (2013.01)

(58) Field of Classification Search
CPC ............ G06F 17/5082; G06F 17/5018; G06F 17/504; G06F 17/5072; G06F 17/5081
USPC .......................... 716/111, 115, 136; 703/2, 15
See application file for complete search history.

(56) References Cited

U.S. PATENT DOCUMENTS

| 4,665,377 | A  | * | 5/1987  | Harpaintner ................. 338/195 |
| 5,404,309 | A  | * | 4/1995  | Yamamoto et al. ........... 716/102 |
| 6,057,171 | A  | * | 5/2000  | Chou et al. ...................... 438/15 |
| 6,423,951 | B1 | * | 7/2002  | Elsasser ........................ 219/541 |
| 6,502,230 | B1 | * | 12/2002 | Graef et al. .................... 716/113 |
| 6,543,035 | B2 | * | 4/2003  | Ohba et al. ..................... 716/112 |
| 6,789,248 | B1 | * | 9/2004  | Lu et al. ......................... 716/104 |
| 6,854,100 | B1 | * | 2/2005  | Chuang et al. ................. 716/115 |
| 7,703,051 | B2 | * | 4/2010  | Grudin et al. ................. 716/136 |
| 9,098,660 | B2 | * | 8/2015  | Yen ..................... G06F 17/5036 |
| 2002/0056073 | A1 | * | 5/2002 | Satoh et al. ....................... 716/5 |
| 2002/0124229 | A1 | * | 9/2002 | Ohba et al. ....................... 716/5 |
| 2004/0123257 | A1 | * | 6/2004 | Chang et al. ..................... 716/5 |
| 2005/0256921 | A1 | * | 11/2005 | Amekawa et al. ............. 708/800 |
| 2005/0266495 | A1 | * | 12/2005 | Hosono et al. ................. 435/7.1 |
| 2006/0107246 | A1 | * | 5/2006 | Nakamura ........................ 716/5 |
| 2006/0249793 | A1 | * | 11/2006 | Beach et al. .................. 257/358 |
| 2007/0143723 | A1 | * | 6/2007 | Kawakami ......................... 716/6 |
| 2008/0134104 | A1 | * | 6/2008 | Chapman et al. ................. 716/2 |
| 2008/0145709 | A1 | * | 6/2008 | Yamashita et al. ............. 428/811 |
| 2010/0155729 | A1 | * | 6/2010 | Yang et al. ...................... 257/52 |
| 2010/0176820 | A1 | * | 7/2010 | Asai .............................. 324/659 |
| 2010/0180241 | A1 | * | 7/2010 | Asai .................................. 716/5 |
| 2011/0066410 | A1 | * | 3/2011 | Yamada ........................... 703/2 |
| 2011/0126162 | A1 | * | 5/2011 | Boerstler et al. .............. 716/100 |
| 2011/0180308 | A1 | * | 7/2011 | Nakamura et al. ............. 174/255 |
| 2012/0065910 | A1 | * | 3/2012 | Yoshino .......................... 702/65 |
| 2012/0326766 | A1 | * | 12/2012 | Camillo-Castillo et al. .. 327/438 |
| 2013/0010529 | A1 | * | 1/2013 | Hayakawa et al. ........... 365/148 |
| 2013/0091480 | A1 |   | 4/2013 | Horlacher |
| 2014/0258955 | A1 | * | 9/2014 | Yen ............................... 716/113 |

* cited by examiner

*Primary Examiner* — Phallaka Kik
(74) *Attorney, Agent, or Firm* — Winston Hsu; Scott Margo

(57) ABSTRACT

A computer implemented method for performing extraction is provided in the present invention. First, a layout of a semi-conductor circuit having a resistor is imported by using a computer wherein a device region is defined in the layout and the resistor is located within the device region. Next, the device region of the layout are extracted, and a compensation value of Rs (Rc) is obtained according to the extracting step. An adjustment process is performed according to Rc to obtained a refined R value.

16 Claims, 4 Drawing Sheets

| Distance / Layer density | $DI_1$ | $DI_2$ | $\cdots$ | $DI_n$ |
|---|---|---|---|---|
| $DE_1$ | $R_{11}$ | $R_{21}$ | $\cdots$ | $R_{n1}$ |
| $DE_2$ | $R_{12}$ | $R_{22}$ | $\cdots$ | $R_{n2}$ |
| $\vdots$ | $\vdots$ | $\vdots$ | $\ddots$ | $\vdots$ |
| $DE_m$ | $R_{1m}$ | $R_{2m}$ | $\cdots$ | $R_{nm}$ |
$R_{nm}$ is the Rs compensation (Rc)
FIG. 3
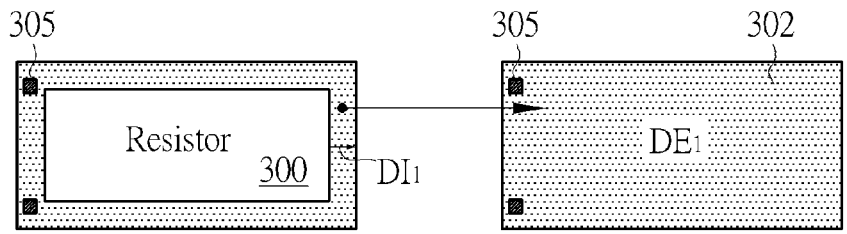
FIG. 4
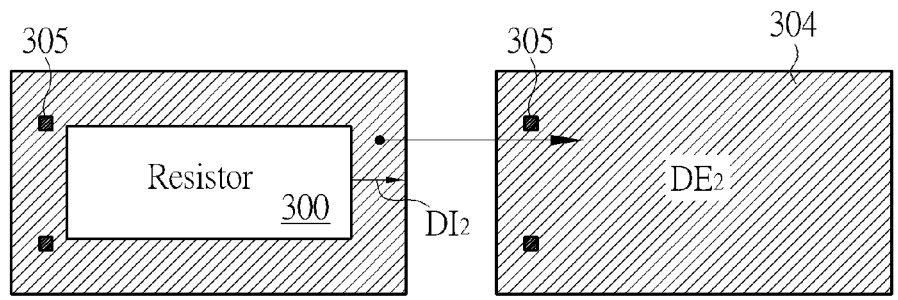
FIG. 5

COMPUTER IMPLEMENTED METHOD FOR PERFORMING EXTRACTION

BACKGROUND OF THE INVENTION

1. Field of the Invention

The invention is related to a computer implemented method, and more particularly, to a computer implemented method for performing extraction in a layout versus schematic (LVS) process.

2. Description of the Prior Art

A computer programmed with layout verification software is normally used to verify that a design of an integrated circuit (IC) chip conforms to certain predetermined tolerances that are required by a process to be used in fabricating the chip, to ensure that a layout connectivity of the physical design of the IC matches the logical design of the IC represented by a schematic, and to extract parasitic resistance and capacitance of the IC. These are all very important steps for guaranteeing the properties of the chip manufactured by the process before the tape out of the circuit.

Methods for checking the consistency between the physical design and the logical design of the IC is called layout versus schematic (LVS) process. There are numerous metal lines, poly-silicon shapes, and diffusions in close proximity to one another on each semiconductor chip, all of miniscule dimension, which must be fabricated to exacting tolerances. As technologies advance, smaller and smaller dimensions are used in lithography. All of these semiconductor layers must be designed and fabricated to exacting tolerances. To meet the tight tolerances requirement in modern manufacturing processes, a LVS process which is more accurate is still needed.

SUMMARY OF THE INVENTION

It is therefore one objective of the present invention to provide a computer implemented method for performing extraction in an LVS process so as to improve the accuracy of the LVS process.

According to one embodiment of the present invention, a computer implemented method for performing extraction is provided. First, a layout of a semiconductor circuit having a resistor is imported by using a computer wherein a device region is defined in the layout and the resistor is located within the device region. Next, the device region of the layout are extracted, and a compensation value of Rs (Rc) is obtained according to the extracting step. An adjustment process is performed according to Rc to obtained a refined R value.

The present invention is featured by providing a compensation value for the Rs value (Rc), so as to more precisely estimate the R value of the resistor from the layout. By doing this, the consistency between the physical design and the logical design of the IC can be checked more precisely.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 shows a schematic diagram of the lookup table in the computer implemented method according to one embodiment of the present invention.

FIG. 4, FIG. 5 and FIG. 6 show schematic diagrams showing the layer density and the layer distance of different device region.

DETAILED DESCRIPTION

To provide a better understanding of the presented invention, preferred embodiments will be described in detail. The preferred embodiments of the present invention are illustrated in the accompanying drawings with numbered elements.

The method proposed in the present invention is related to a computer implemented method, and more particularly, to a computer implemented method for performing extraction in an LVS process. The present invention especially focuses on passive semiconductor unit and more specifically, focuses on the physical property of a resistor.

Equation 1 shows a relationship between the resistance (R), the sheet resistance (Rs), the length (L) and the width (W) of a resistor.

$$R = Rs \times (L/W) \quad \text{(Equation 1)}$$

According to Equation 1, R value of resistor is determined by Rs value and the width, the length of the resistor. The term "width" refers to a distance between two borders of the resistor, which is perpendicular to the direction of the current, and the term "length" refers to a distance between two borders of the resistor, which is parallel to the direction of the current. In conventional LVS process, Rs is related to the material of the resistor and is a predetermined value, so R value of a resistor is determined only by the width and the length of the resistor. However, with the shrinkage of size of the semiconductor units, R value of a resistor is affected by nearby semiconductor units and is not determined only by the width and the length itself. Accordingly, R value of a resistor cannot be estimated precisely by using conventional method. The method proposed in the present invention therefore utilizes a compensation value for compensating the Rs value based some parameters of adjacent circuit, thereby obtaining a refined R value.

Figure 1:
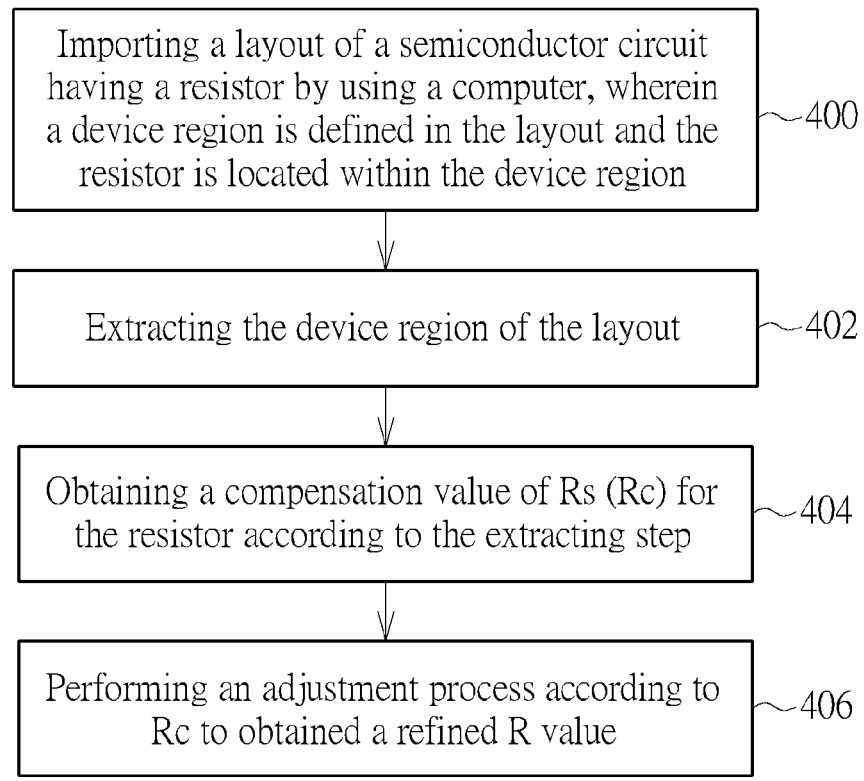
FIG. 1 shows a flow chart of the computer implemented method for performing extraction according to one embodiment of the present invention.

Please refer to FIG. 1, which shows a flow chart of the computer implemented method for performing extraction according to one embodiment of the present invention. As shown in FIG. 1, the computer implemented method for performing extraction in the present invention includes the following steps:

Step 400: importing a layout of a semiconductor circuit having a resistor by using a computer, wherein a device region is defined in the layout and the resistor is located within the device region;

Step 402: extracting the device region of the layout;

Step 404: obtaining a compensation value of Rs (Rc) for the resistor according to the extracting step;

Step 406: performing an adjustment process according to Rc to obtained a refined R value.

A detailed description of the computer implemented method for performing extraction in the present invention will be shown in the following context.

Figure 2:
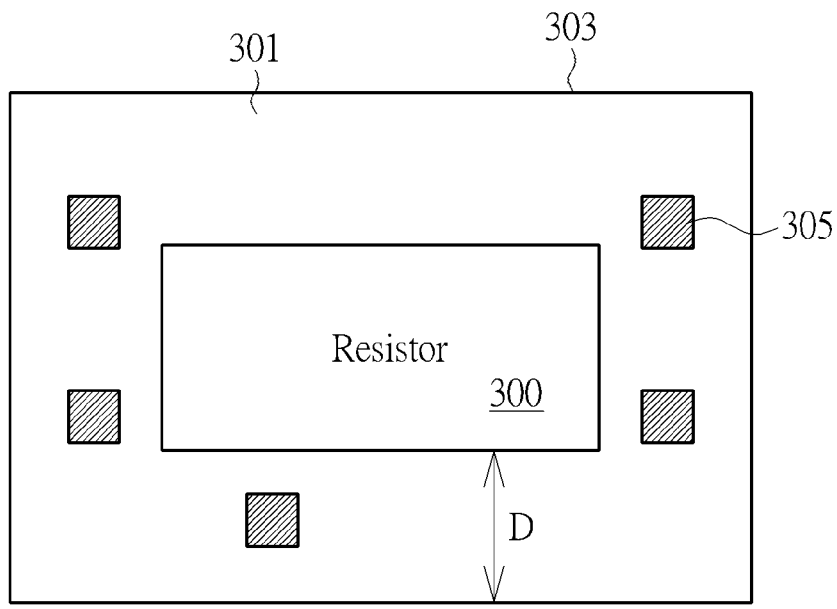
FIG. 2 shows a schematic diagram of the resistor and the device region.

First, a layout of a semiconductor circuit having a resistor is imported by using a computer, and a device region is defined in the layout and the resistor is located within the device region (step 400). In one embodiment, the semiconductor circuit may comprise a semiconductor chip or a portion thereof. The layout may be in the form of GDSII or OASIS™ or some other format for describing various shapes, sizes, and relationships of elements in a semiconductor layout. The layout may be for a semiconductor chip or die or portion thereof. The layout may be imported into a database to be included with other information about the chip. All chip layers may be imported, a subset of the chip layers, or only a single layer. The term "computer" in the present invention refers to any programmable apparatus that can execute any computer program instructions including multiple programs or threads. The multiple programs or threads may be processed approximately simultaneously to enhance utilization of the processor and to facilitate substantially simultaneous functions. A resistor may be included in the layout of the semiconductor circuit, such as a high-resistance poly resistor, a metal resistor or other types of resistors. The resistor is located within a device region, in which the area of the device region is defined by the designer according to the design rule or the property of the device. Generally, one resistor corresponds to one device region, and vice versa. Please refer to FIG. 2, which shows a schematic diagram of the device region and the resistor. As shown, the device region 303 defines the logical area of the resistor 300. As noted above, some layers, such as the material layer 305 adjacent to the resistor 300 would affect the resistance of the resistor 300. The material layer 305 is determined according to the type of the resistor 300, meaning that different types of resistors would correspond to different types of material layers. For example, when the resistor 300 is a high-resistance poly resistor, the material layer 305 refers to the dopant region, and when the resistor 300 is a metal resistor in a metal interconnection system, the material layer 305 refers to other metal layers, such as metal one (M1), metal two (M2) or the like.

After imported by the computer, the layout of the semiconductor circuit, especially the device region 303, is analyzed to extract some parameters or values of the device region 303 and the resistor 300 (Step 402). The analyzing process may comprise measuring lengths, widths or spacing for geometric shapes within the layout. In one embodiment, a width, a length, as well as an Rs value of the resistor 300 in the device region 303 are extracted. Further, the area of the device region 303 is also extracted, and by recognizing the type of the resistor 300, the corresponding material layer 305 is also recognized and extracted. Thereafter, the "layer density" and the "layer distance" can be calculated. The term "layer density" refers to a ratio of the total area of the material layer 305 and the total area of the device region 303. The term "layer distance" refers to the distance between a border of the resistor 300 and a border of the device region 303 (for example, distance "D" in FIG. 3).

Next, a compensation value for Rs (Rc) is obtained according to the extraction step (step 404). As mentioned above, R value of a resistor 300 is easily affected by adjacent material layer 305 in the device region 303. The present invention therefor provides a compensation value for Rs (Rc) to compensate the noise from the material layer 305. In one embodiment, Rc of the resistor can be obtained by a lookup table, which can be constructed in advance and saved in the database before the LVS process. According to the type of the resistor 300, a corresponding lookup table is chosen. Please refer to FIG. 3, which shows a schematic diagram of the lookup table in the computer implemented method according to one embodiment of the present invention. As shown in FIG. 3, the lookup table in the present embodiment is a two-dimensional lookup table, meaning that the lookup table is based on two parameters, which are layer density ($DE_m$) and the layer distance ($DI_n$).

Figure 6:
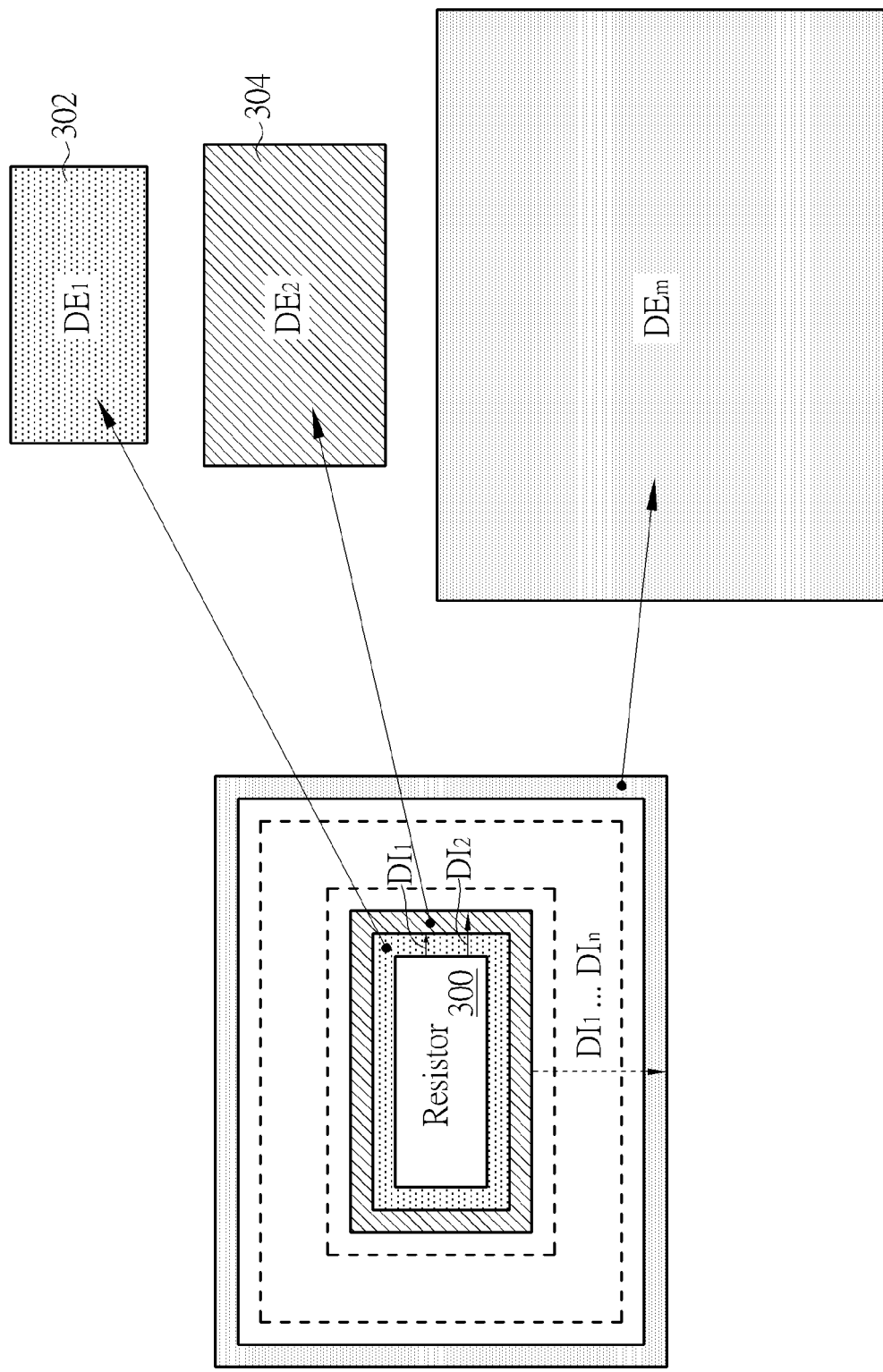

In one embodiment, different lookup tables corresponding to different types of resistors can be constructed before the extraction process by screening a resistor and a plurality of device regions with different layer density and layer distances. Please refer to FIG. 4, FIG. 5 and FIG. 6, which are schematic diagrams showing the layer density and the layer distance of different device regions. Taking FIG. 4 for example, when the resistor refers to the numeral reference 300, and the device region refers to the numeral reference 302, the layer density is $DE_1$ and the layer distance is $DI_1$, a compensation value of Rs, $R_{11}$, is estimated and filled in the lookup table. As shown in FIG. 5, when the resistor refers to the numeral reference 300, and the device region refers to the numeral reference 304, the layer density is $DE_2$ and the layer distance is $DI_2$, a compensation value of Rs, $R_{22}$, is estimated and filled in the lookup table. After screening the plurality of layouts, as shown in FIG. 6, a lookup table shown in FIG. 3 can be constructed. When carrying out the extraction process, as the Rs value of the resistor, a layer density and a distance between the border of the device region and the resistor are extracted, a corresponding compensation value of Rs (Rc) can therefore be obtained by the lookup table.

After receiving the compensation value of Rs (Rc) from the lookup table, an adjustment process according to Rc is performed to obtained a refined R value for the resistor (Step 406). In one embodiment, the adjustment process includes changing the original Rs value of the resistor according to the lookup table, so as to obtain a refined R value. For example, the refined R value can be obtained by Equation 2:

$$\text{Refined } R = (Rs + Rc) \times (L/W) \tag{Equation 2}$$

Thereafter, the refined R value of the resistor is checked it meets the required R value of the original schematic design. In another embodiment, the adjustment process includes changing a width and/or a length of the resistor of the layout in an OPC process. In one embodiment, since amending the length of the resistor would easily result in open or short phenomenon of the resistor, preferably, the adjustment process is to change the width of the resistor of the layout in an OPC process. A refined R value is therefore obtained and is then checked out to see if it can meet the required R value.

Figure 7:
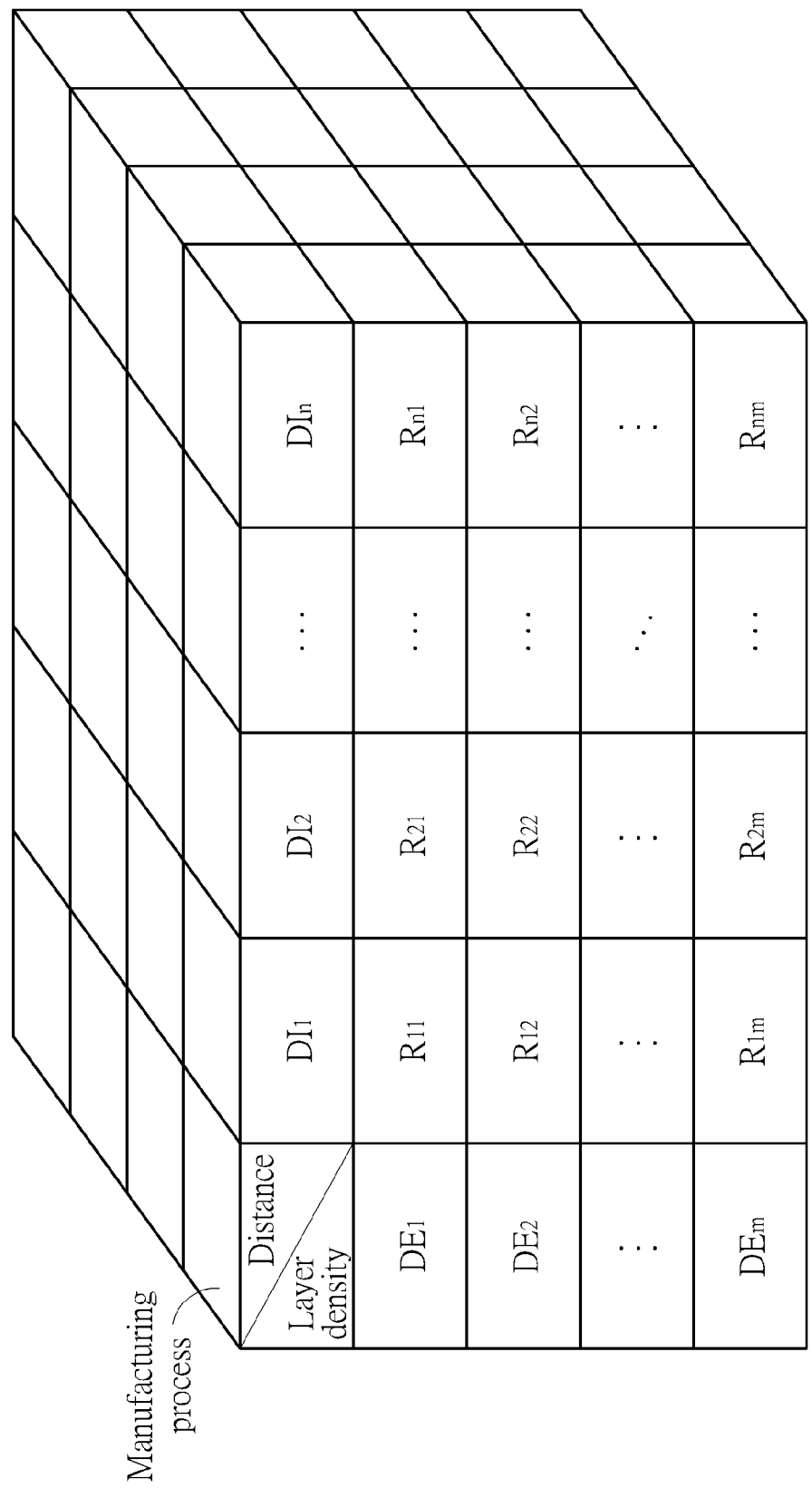
FIG. 7 shows a schematic diagram of the lookup table in the computer implemented method according to another embodiment of the present invention.

It is one salient feature in the present invention that uses a compensation value for the Rs value (Rc), so the R value of the resistor can be estimated more accurately from the layout. The Rc value can be obtained, for example, from a two dimensional lookup table in FIG. 3, which is based on the layer density and the layer distance. In another embodiment, besides the two parameters, other parameter that may affect R value of a resistor can be further considered, for example, the parameters in manufacturing process, thereby forming a three-dimensional lookup table. Please refer to FIG. 7, which shows a schematic diagram of the lookup table in the computer implemented method according to another embodiment of the present invention. As shown in FIG. 7, the lookup table for the compensation value of R is a three-dimensional lookup table, which is based on layer density of the layout ($DE_m$), the layer distance ($DI_n$), and the manufacturing process. The term "manufacturing process" refers to any parameters in semiconductor process for forming the resistor that would affect the resistance of the resistor. For instance, these parameters can include temperature, etchant or their combination and is not limited thereto. If more than one manufacturing process should be concerned, a multi-dimensional lookup table can be correspondingly provided. By using the multi-dimensional lookup table, which considers the layer density, the layer distance and the manufacturing process, a more precise compensation value of Rs can be obtained.

In light of above, the computer implemented method for performing extraction in the present invention is featured in providing a compensation value for the Rs value (Rc) to more precisely estimate the R value of the resistor from the layout. It is understood that the feature of the present invention can be further applied to other passive semiconductor units such as capacitor or inductor where the physical properties thereof are easily affected by adjacent circuit. By doing this, the consistency between the physical design and the logical design of the IC can be checked more precisely by the LVS process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A computer implemented method for performing extraction, comprising:
    importing a layout of a semiconductor circuit having at least one resistor, wherein a device region is defined in the layout and the resistor is located within the device region;
    extracting the device region of the layout;
    obtaining a compensation value Rc of sheet resistance Rs for the resistor according to the extracting step;
    performing an adjustment process according to Rc to obtained a refined R value by using a computer; and
    forming a resistor with the refined R value in an integrated circuit.

2. The computer implemented method for performing extraction according to claim 1, in the step of extracting the device region of the layout, further comprising extracting a width, a length of the resistor.

3. The computer implemented method for performing extraction according to claim 1, in the step of extracting the device region of the layout, further comprising recognizing a material layer in the device region according to the type of the resistor.

4. The computer implemented method for performing extraction according to claim 3, in the step of extracting the device region of the layout, further comprising calculating a layer density of the material layer in the device region.

5. The computer implemented method for performing extraction according to claim 3, in the step of extracting the device region of the layout, further comprising calculating a layer distance between a border of the device region and a border of the resistor.

6. The computer implemented method for performing extraction according to claim 1, wherein Rc is obtained by using a lookup table.

7. The computer implemented method for performing extraction according to claim 6, wherein the lookup table is a two-dimensional lookup table.

8. The computer implemented method for performing extraction according to claim 6, wherein parameters of the lookup table comprise a layer density of the device region and a distance between the resistor and a border of the device region.

9. The computer implemented method for performing extraction according to claim 6, the lookup table is a three-dimensional lookup table.

10. The computer implemented method for performing extraction according to claim 9, wherein parameters of the lookup table comprise a layer density of the device region and a distance between the resistor and a border of the device region, and a parameter of the manufacturing process for the layout.

11. The computer implemented method for performing extraction according to claim 10, wherein the parameter of the manufacturing process comprises temperature.

12. The computer implemented method for performing extraction according to claim 1, before the step of importing the layout of the semiconductor circuit, further comprising constructing a lookup table for a compensation value of Rs.

13. The computer implemented method for performing extraction according to claim 1, wherein the adjustment process includes changing an Rs value of the resistor.

14. The computer implemented method for performing extraction according to claim 13, wherein the refined R value is obtained by Rc plus Rs.

15. The computer implemented method for performing extraction according to claim 1, wherein the adjusting process includes changing a width and/or a length of the resistor of the layout in an OPC process.

16. The computer implemented method for performing extraction according to claim 15, wherein the adjusting process includes changing the width of the resistor of the layout.

* * * * *